(12) United States Patent
Hao et al.

(10) Patent No.: US 7,234,222 B1
(45) Date of Patent: Jun. 26, 2007

(54) METHODS AND APPARATUS FOR OPTIMIZING THE DELIVERY OF A SET OF GASES IN A PLASMA PROCESSING SYSTEM

(75) Inventors: Fangli Hao, Cupertino, CA (US); John Daugherty, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 380 days.

(21) Appl. No.: 10/672,085

(22) Filed: Sep. 26, 2003

Related U.S. Application Data (60) Provisional application No. 60/414,464, filed on Sep. 26, 2002.

(51) Int. Cl.
*B23P 25/00* (2006.01)
*B21D 39/00* (2006.01)

(52) U.S. Cl. .................. 29/458; 29/507; 29/890.14

(58) Field of Classification Search .................. 29/506, 29/507, 421.2, 523, 451, 447, 890.14, 469.5, 29/890.053, 33 T, 33 D, 234, 282, 235; 156/294, 156/387; 427/DIG. 10, 11; 285/381.1; 264/269, 264/516, 36.17
See application file for complete search history.

(56) References Cited

U.S. PATENT DOCUMENTS 3,050,786 A * 8/1962 Alexander et al. .......... 264/573
3,315,348 A * 4/1967 Donovan et al. .......... 29/469.5
3,372,462 A * 3/1968 Bradley et al. ................ 29/447
3,422,856 A * 1/1969 Hunter et al. ................ 138/143
4,024,008 A * 5/1977 Gregornik et al. ....... 156/272.4

OTHER PUBLICATIONS

"A Short Introduction to Corrosion and its Control," 9 pp.
"Scientific Tubing: Glass Lined Tubing, Peeksil Tubing, Fused Silica Tubing", www.SGE.com, 6 pp.
Henderson et al., "Cylinder Package effects on the purity of the electronic specialty gases" (Jun. 1997) Unknown publisher, vol. 40, Iss. 6, 3 pp.
www.plastic-bottles-guide.com, "Blow Molding Techniques", (Sep. 2003) 2 pp.
www.dupont.com/teflon, "Techniques for Fabricating DuPont FEP Film—Heat Bonding", (Sep. 2003) | 2003 E.I. duPont de Nemours and Co., 4 pp.
www.plasticsindustry.org/industry/process, "processing methods" (Sep. 2003). | 1999 The Society of the Plastics Industry, 4 pp.
www.matweb.com, "AISI Type 316 Stainless Steel, annealed bar" (Sep. 2003) | 1996-2004 by Automation Creations, Inc., 3 pp.

(Continued)

*Primary Examiner*—Marc Jimenez
(74) *Attorney, Agent, or Firm*—IP Strategy Group, PC (57) ABSTRACT

A method for configuring a gas distribution channel, the gas distribution channel being configured for introducing a plasma source gas into a plasma processing chamber of a plasma processing system is disclosed. The method includes providing a metal conduit, providing a thermo-plastic tubular structure, and disposing the thermoplastic tubular structure within the metal conduit. The method also includes applying heat and pressure to the thermo-plastic tubular structure, thereby causing the thermo-plastic tubular structure to mechanically couple with the metal conduit wherein an outer surface of the thermo-plastic tubular structure is longitudinally coupled with an inner surface of the metal conduit.

18 Claims, 11 Drawing Sheets

OTHER PUBLICATIONS

Entegris, "Teflon l Material Data Sheet", 2002 Entegris, Inc., 2 pp.
www.gordonengland.co.uk, "Corrosion—The Corrosion Process" (Sep. 2003) 9 pp.
Saleem et al., "Ultrapure Materials—Gases: Examining the corrosison resistance of chromium-passivated stainless-steel tubes", (Sep. 2003) l 1997-2003 Canon Communications LLC, www.micromagazine.com/archive.

Collins et al., "Stainless Steel for Semiconductor Applications", (Oct. 1997) 39th Mech. Working & Steel Proc. Conference Proceedings of the Iron & Steel Soc., 1998, pp. 607-619.
Collins, "Stainless Steels for Semiconductor Gas Applications", (Jul./Aug. 2002), Gases and Technology, pp. 10-15.
www.mcnallyinstitute.com, "Corrossion problems associated with stainless steel 4-1", (Sep. 2003).

* cited by examiner

METHODS AND APPARATUS FOR OPTIMIZING THE DELIVERY OF A SET OF GASES IN A PLASMA PROCESSING SYSTEM

REFERENCE TO RELATED APPLICATION

This application claims benefit of U.S. Provisional Patent Application No. 60/414,464 filed Sep. 26, 2002, which is incorporated by reference.

BACKGROUND OF THE INVENTION

The present invention relates in general to substrate manufacturing technologies and in particular to methods for methods for optimizing the delivery of a set of gases in a plasma processing system.

In the processing of a substrate, e.g., a semiconductor wafer or a glass panel such as one used in flat panel display manufacturing, plasma is often employed. As part of the processing of a substrate (chemical vapor deposition, plasma enhanced chemical vapor deposition, physical vapor deposition, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. Appropriate etchant source gases (e.g., $C_4F_8$, $C_4F_6$, $CHF_3$, $CH_2F_2$, $CF_4$, $CH_3F$, $C_2F_4$, $N_2$, $O_2$, HBr, Ar, Xe, He, $H_2$, $NH_3$, $SF_6$, $BCl_3$, $Cl_2$, etc.) are then flowed into the chamber and ionized to form a plasma to etch exposed areas of the substrate.

A reliable supply of ultrapure electronic specialty gases is critical to maintaining plasma processing system uptimes necessary to maximize productivity and manufacturing yield in semiconductor fabs. The delivery of such gases poses special challenges, however, because of their highly corrosive and reactive nature.

In particular, corrosion created in the gas delivery system may substantially reduce substrate yield. For example, in the process of etching a substrate, pollutants may be generated from materials in the etchant gases (e.g., carbon, fluorine, hydrogen, nitrogen, oxygen, silicon, boron, chlorine, etc.), from materials in the substrate (e.g. photoresist, silicon, oxygen, nitrogen, aluminum, titanium, etc.), or from structural materials within the plasma processing chamber or gas delivery system (e.g., stainless steel, aluminum, quartz, etc.).

It is commonly understood in the art, that a particle one-tenth the size of the thinnest line can substantially damage a substrate. Subsequently, components in contact with the process gases are generally engineered to minimize or eliminate potential sources of system contamination. Since a gas delivery system may be a significant source of contamination, gas conduits are often made of a set metals (e.g., electropolished stainless steel, copper (Cu), aluminum (Al), metal alloys, etc.).

For example, stainless steel is a substantially non-porous material commonly made of iron (Fe), with significant alloying additions of chromium (Cr), which gives the metal its "stainless" or corrosion-resistant characteristics, and nickel (Ni), which stabilizes the austenite and makes the metal nonmagnetic and tough. Electropolishing generally improves the surface chemistry of the part, enhancing the passive oxide film and removing any free iron from the surface.

In general, stainless steel comprises a "passive" film coating which is resistant to further "oxidation" or rusting. This film forms rapidly when exposed to oxygen. Once formed the metal has become "passivated" and the oxidation or "rusting" rate will substantially slow down.

However, plasma processing gasses (e.g., fluorine, chlorine, bromine, etc.) may still eventually penetrate this passive film and will allow corrosive attack to occur, particularly at specific points within a gas delivery system, such as weld bead and heat-affected zones (HAZ). In particular, the process of welding stainless steel often creates slag and layer re-deposits at the weld joints, potentially allowing corrosion. For example, materials such as sulfur (S), manganese (Mn), silicon (Si), and aluminum (Al) may be present at the weld site and tend to react with corrosive plasma processing gases such as the halogen, and produce corrosion and contaminants.

The degree of corrosion and hence the amount of contamination may depend on many factors, such as gas concentration and purity, moisture content, temperature, localized inhomogeneities in material, system flow rates, time of exposure, frequency of exposure. For instance, halogen gases, such as hydrogen chloride or hydrogen bromide, will corrode stainless steel when moisture levels exceed a few parts per million (ppm).

Although moisture can be reduced, it generally cannot be completely eliminated. For example, although plasma processing gases are normally stored in a purified form in compressed gas cylinders, moisture can be introduced into the gas distribution system when the cylinders are replaced, or when maintenance is performed on the processing chamber.

One method for reducing corrosion in the gas delivery system is to coat the inner surface of the tubular structures with a non-corroding material. In one example, a plastic coating is placed on a metal surface as a protective layer through a spraying or dipping process. However, spraying or dipping methods are not readily performed on small diameter delivery lines since access to the inside of the line is limited. In addition, both methods are unable to control the coating uniformity and surface finish, potentially affecting the gas distribution characteristics and substrate yield.

Figure 1:
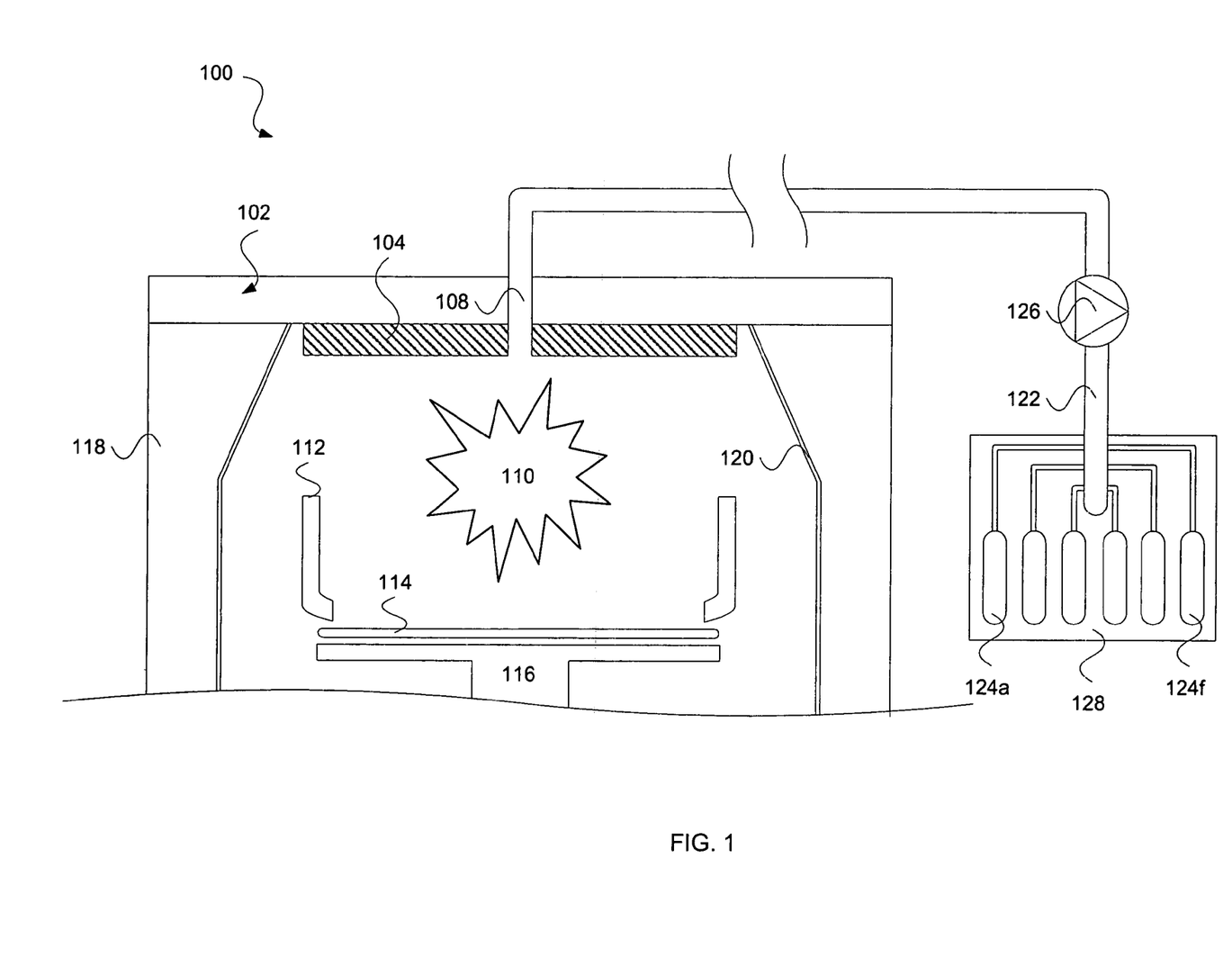
FIG. 1 describes a simplified cross-sectional view of a plasma processing system.

Referring now to FIG. 1 a simplified cross-sectional view of a plasma processing system 100 is shown. Generally, an appropriate set of gases is flowed into chamber 102 through an inlet 108 from gas distribution system 122. These etchant gases may be subsequently ionized to form a plasma 110, in order to process (e.g., etch or deposition) exposed areas of substrate 114, such as a semiconductor wafer or a glass pane, positioned on an electrostatic chuck 116. Gas distribution plate 120, along with liner 112, help to optimally focus plasma 110 onto substrate 114.

Gas distribution system 122 is commonly comprised of compressed gas cylinders 124a–f containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc.). Gas cylinders 124a–f may be further protected by an enclosure 128 that provides local exhaust ventilation. Mass flow controller 126 is commonly a self-contained device (consisting of a transducer, control valve, and control and signal-processing electronics) commonly used in the semiconductor industry to measure and regulate the mass flow of gas to the plasma processing system.

In general, plasma processing gases are often stored compressed gas cylinders 124a–f or several months prior to use in a plasma processing system. Furthermore, many of the plasma processing gases are stored under pressure in a liquefied form. In particular, highly reactive, liquefied plasma processing gas is often typically stored in nickel cylinders to preclude the dissolution of metallic contaminants.

As with the plasma processing system as a whole, moisture in the gas distribution system may react with plasma processing gases to make other contaminant species. For example, HF and mixed tungsten oxyfluorides may be observed upon introducing $WF_6$ into a wet environment.

Figure 2:
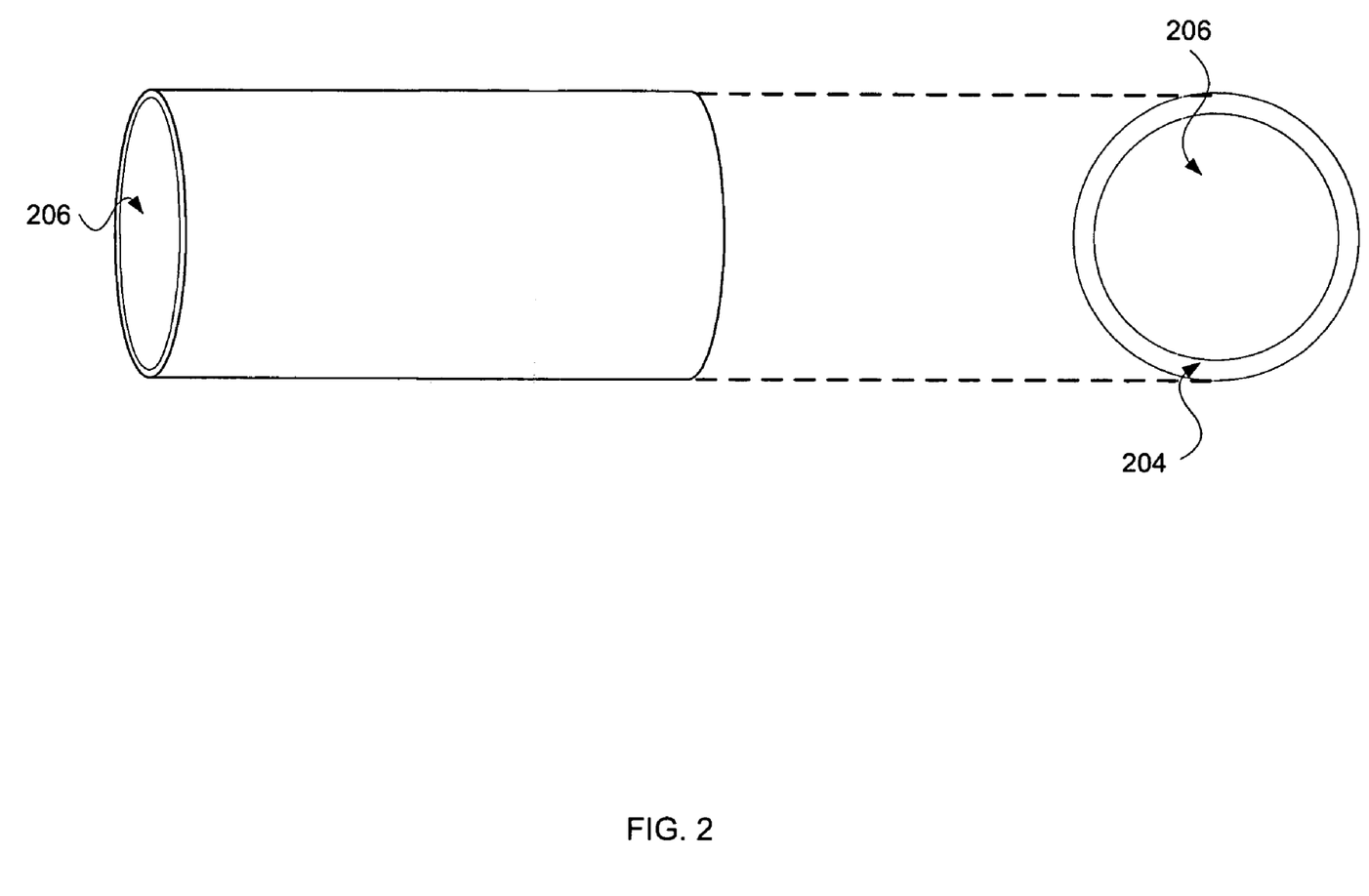
FIG. 2 describes a simplified diagram of a gas conduit as used in a gas distribution system.

Referring now to FIG. 2, a simplified diagram of a gas conduit as used in a gas distribution system is shown. For example, a mass flow controller pumps the mixed plasma processing gasses along longitudinal cavity 206 of tube 204 to the plasma processing chamber. Tubes used in gas distribution systems are commonly made of stainless steel in order to resist pitting, corrosion, cracking, and corrosion fatigue.

Figure 3:
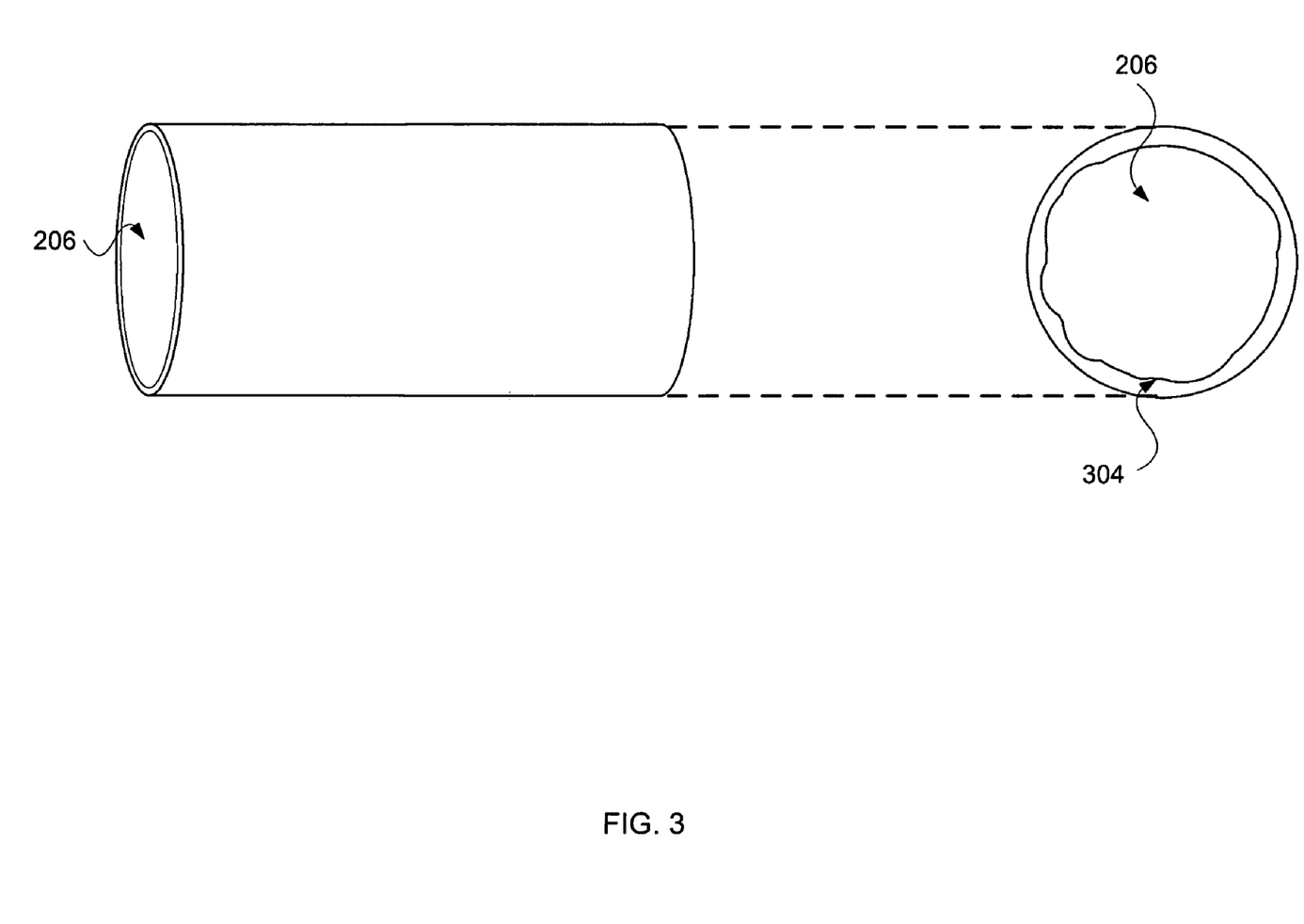
FIG. 3 describes a simplified diagram of a tubular structure in which corrosion has occurred.

Referring now to FIG. 3, a simplified diagram of the tubular structure of FIG. 2 is shown, in which corrosion has occurred. As previously described, plasma processing gasses may still eventually penetrate this passive film and will allow corrosive attack to occur, particularly at specific points within the gas delivery system, such as weld bead and heat-affected zones (HAZ), such as on inner surface 304.

In view of the foregoing, there are desired methods and apparatus for optimizing the delivery of a set of gases in a plasma processing system.

SUMMARY OF THE INVENTION

The invention relates, in one embodiment, to a method for configuring a gas distribution channel, the gas distribution channel being configured for introducing a plasma source gas into a plasma processing chamber of a plasma processing system. The method includes providing a metal conduit, providing a thermo-plastic tubular structure, and disposing the thermo-plastic tubular structure within the metal conduit. The method also includes applying heat and pressure to the thermo-plastic tubular structure, thereby causing the thermo-plastic tubular structure to mechanically couple with the metal conduit wherein an outer surface of the thermo-plastic tubular structure is longitudinally coupled with an inner surface of the metal conduit.

The invention relates, in one embodiment, to a method for configuring a gas distribution channel, the gas distribution channel being configured for introducing a plasma source gas into a plasma processing chamber of a plasma processing system. The method includes providing a metal conduit and providing a resin. The method further includes disposing the resin within the metal conduit by molding injection, wherein the resin is longitudinally coupled with the inner surface of the metal conduit.

The invention relates, in one embodiment, to a gas distribution system for distributing plasma processing gases in a plasma processing chamber of a plasma processing. The method includes a set of channels, each of the channels comprising a thermoplastic tubular structure and a metal conduit, an outer surface of the thermoplastic tubular structure being longitudinally coupled with an inner surface of the metal conduit. The method also includes a mass flow controller coupled to control a flow of one of the plasma processing gases through the one of the channels.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that the introduction of a set of thermoplastic polymers to a gas distribution system may substantially reduce the amount of containments in a plasma process system.

As previously stated, conduits in gas distribution systems are often made of electropolished stainless steel. For example, AISI Type 316 Stainless Steel, annealed bar, is commonly used. Type 316 is comprised of:

| COMPONENT | WEIGHT % |
| --- | --- |
| Carbon (C) | 0.08 |
| Chromium (Cr) | 17 |
| Iron (Fe) | 65 |
| Manganese (Mn) | 2 |

-continued

| COMPONENT | WEIGHT % |
|---|---|
| Molybdenum (Mo) | 2.5 |
| Nickel (Ni) | 12 |
| Phosphorus (P) | 0.045 |
| Sulfur (S) | 0.03 |
| Silicon (Si) | 1 |

Generally, stainless steel conduits are assembled using non-welded or welded bonds. Non-welded bonds are generally formed by brazing, or soldering at high temperatures. Gas is the heat source, and various combinations are used; oxygen-acetylene, oxygen-MAPP (e.g., methylacetylene-propadiene, stabilized) gas, and oxygen-propane are all common.

In the brazing process, a filler material is used whose melting point is lower than that of the melting point of stainless steel. A flux is then coated on the stainless steel, which cleans and prevents the formation of oxides. Once the melting point of the filler metal is reached, the molten filler flows into the joint by capillary action and bonds the stainless steel materials together, resulting in a very strong joint.

Likewise, welded bonds are formed by heating the stainless steel to its melting point, and filler metal, if used, is fed into the molten pool. When the bond cools, the stainless steel materials have become fused at the joint. General, the heat source for fusion welding can be gas or electric (e.g., arc welding).

However, as previously described, the process of welding stainless steel often creates slag and layer re-deposits at the weld joints, potentially allow corrosion. For example, materials such as sulfur (S), manganese (Mn), silicon (Si), and aluminum (Al) may be present at the weld site and tend to react with corrosive plasma processing gases such as the halogen, and produce corrosion and contaminants.

Plasma processing gasses (e.g., fluorine, chlorine, bromine, etc.) may still eventually penetrate this passive film and will allow corrosive attack to occur, particularly at specific points within a gas delivery system, such as weld bead and heat-affected zones (HAZ). In particular, the process of welding stainless steel often creates slag and layer re-deposits at the weld joints, potentially allow corrosion. For example, materials such as sulfur (S), manganese (Mn), silicon (Si), and aluminum (Al) may be present at the weld site and tend to react with corrosive plasma processing gases such as the halogen, and produce corrosion and contaminants. Since substantially removing corrosion from the gas distribution system may be time consuming, it is generally cleaned or replaced only when particle contamination levels reach unacceptable levels, or as part of scheduled preventive maintenance (PM), or when the concentrations of molecular or atomic contaminants (e.g., Cr, Fe, Mn, and other constituents of the gas distribution system) on the workpiece exceed allowable levels.

In a non-obvious fashion, a thermo-plastic polymer is advantageously employed within a gas distribution conduit, to substantially reduce corrosion caused by plasma processing gasses. In one embodiment of the invention, a gas distribution channel may be comprised of an outer stainless steel conduit and a inner thermoplastic polymer tubular structure. In another embodiment of the invention, a gas distribution channel may be comprised of a stainless steel channel, and a thermo-plastic polymer that is molded to the inner surface of the conduit, in a substantially smooth fashion.

In another embodiment of the invention, a gas distribution channel may be comprised of an outer stainless steel conduit, an inner thermo-plastic polymer tubular structure, and a thermo-plastic polymer that is injected between the conduit and the inner thermo-plastic polymer tubular structure. In another embodiment of the invention, a gas distribution channel may be comprised of an outer stainless steel channel, an inner thermo-plastic polymer tubular structure, and a resin that is injected between the outer conduit and the inner thermo-plastic polymer tubular structure. In another embodiment of the invention, the thermo-plastic polymer is PTFE. In another embodiment of the invention, the thermo-plastic polymer is FEP. In another embodiment of the invention, the thermo-plastic polymer is PFA. In another embodiment of the invention, the thermo-plastic polymer is PCTFE. In another embodiment of the invention, the thermo-plastic polymer is CTFE.

Teflon is the registered trademark of the DuPont Company for its fluorocarbon resins. Structurally, there are different types of Teflon resin. Teflon PTFE resin is a polymer consisting of recurring tetrafluoroethylene monomer units (e.g., $CF2-CF2)_n$. PTFE displays a series of unique properties That makes it useful for use in a gas distribution system. It has nearly universal chemical resistance. Insoluble in all solvents below 300° C., and has high service temperature stability up to 250° C. PTFE has very low adhesiveness, a very low friction coefficient, and is extremely hydrophobic. It is tough elastic, easily manufactured.

Teflon FEP possesses similar properties to PTFE, and comprises a Tetrafluoroethylene Hexafluoropropylene-co-polymer [e.g., $CF(CF3)-CF2(CF2-CF2)_n]_m$. The maximum service temperature of 205° C. is lower than PTFE. FEP is thermoplastically moldable (injection molded at temperatures of 320°–360° C. extruded at 350° C.–410° C.) is translucent, flexible, and feels heavy because of its high density.

Teflon PFA also possesses similar properties to PTFE, and further comprises a perfluoroalkyoxy-polymer. PFA has the same advantages as PTFE Teflon with the structure: $[CF(OR,)-CF2(CF2-CF2)_n]_m$. PFA can be melt processed (extruded). The chemical resistance is comparable to PTFE. PFA is translucent and slightly flexible. It has greater mechanical strength and higher temperature tolerance than PTFE. Its melting temperature is 305° C. PFA was first generally used in the semiconductor industry for injection molded wafer carriers and similar articles that resisted aggressive chemicals and high temperature chemical processing.

Figure 4:
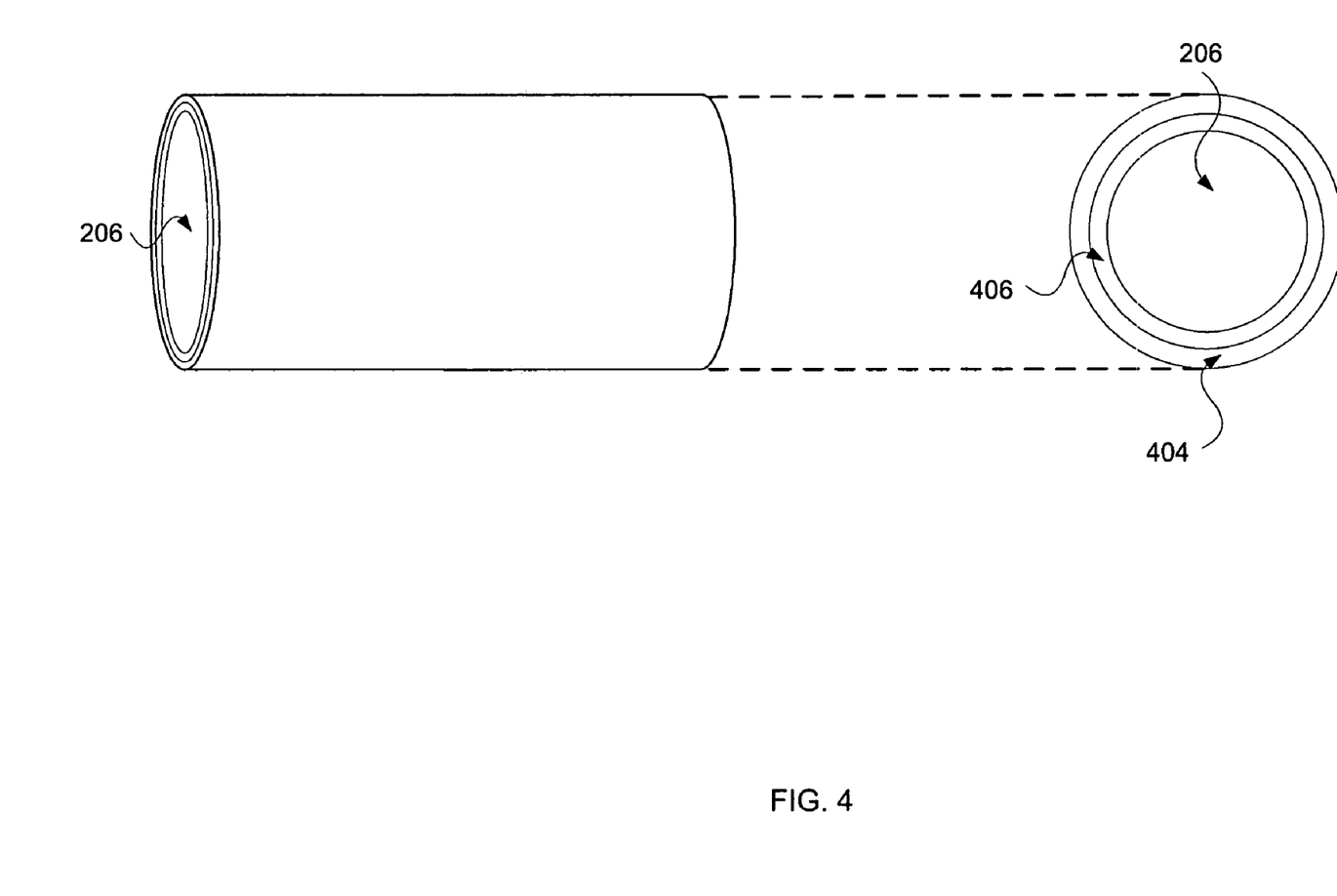
FIG. 4 describes a simplified diagram of a gas distribution conduit with a thermo-plastic polymer tubular structure, according to one embodiment of the invention.

Referring now to FIG. 4, a simplified diagram of a gas distribution conduit with a thermo-plastic polymer tubular structure is shown, according to one embodiment of the invention. Generally, a gas distribution system of channels 206 plasma processing gases through stainless steel conduit 404 (e.g., $C_4F_8$, $C_4F_6$, $CHF_3$, $CH_2F_3$, $CF_4$, $CH_3F$, $C_2F_4$, $N_2$, HBr, $O_2$, Ar, Xe, He, $H_2$, $NH_3$, $SF_6$, $BCl_3$, $Cl_2$, $WF_6$, etc.) from compressed gas cylinders to the plasma processing chamber. In a non-obvious fashion, a thermoplastic polymer tubular structure 406 has been longitudinally coupled to the inner cavity of stainless steel conduit 404, in order minimize corrosion.

Figure 5A:
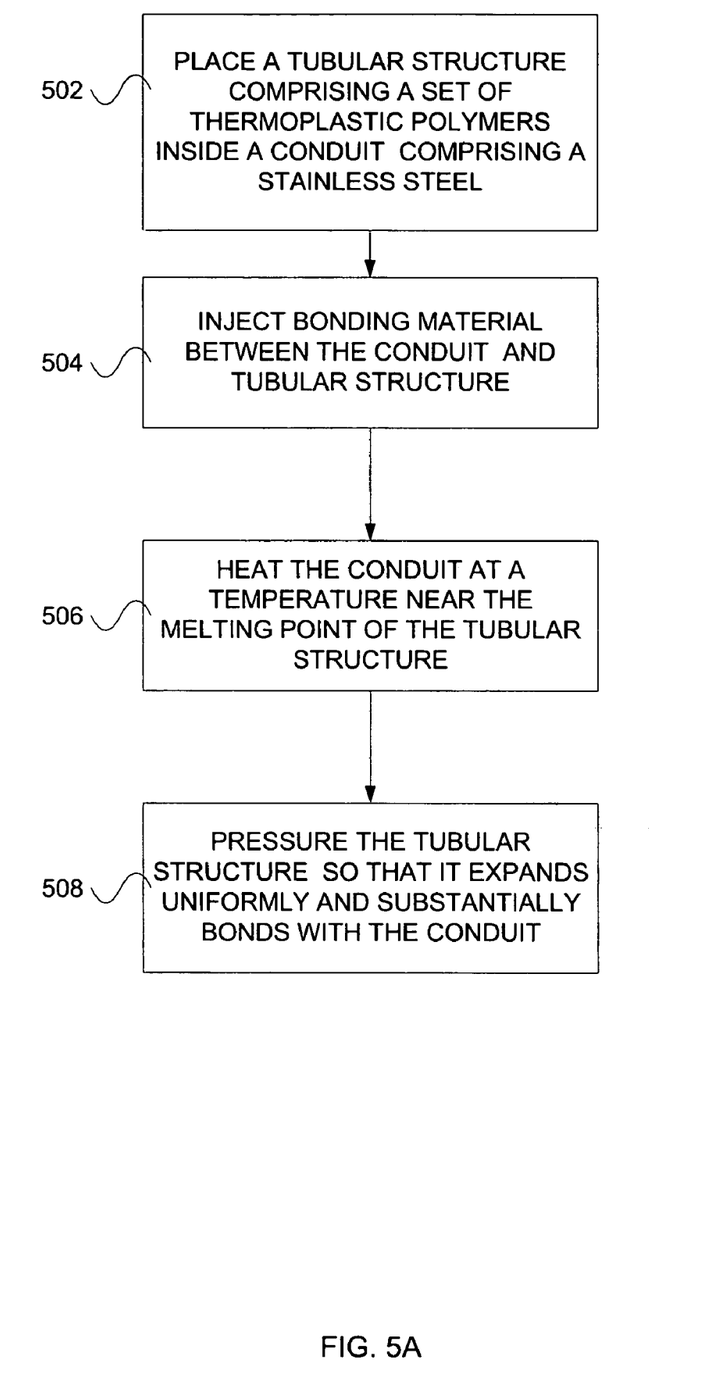
FIGS. 5A–C describe a simplified set of steps in which a thermoplastic polymer tube is coupled to a stainless steel conduit in a gas distribution system, according to one embodiment of the invention.
Figure 5B:
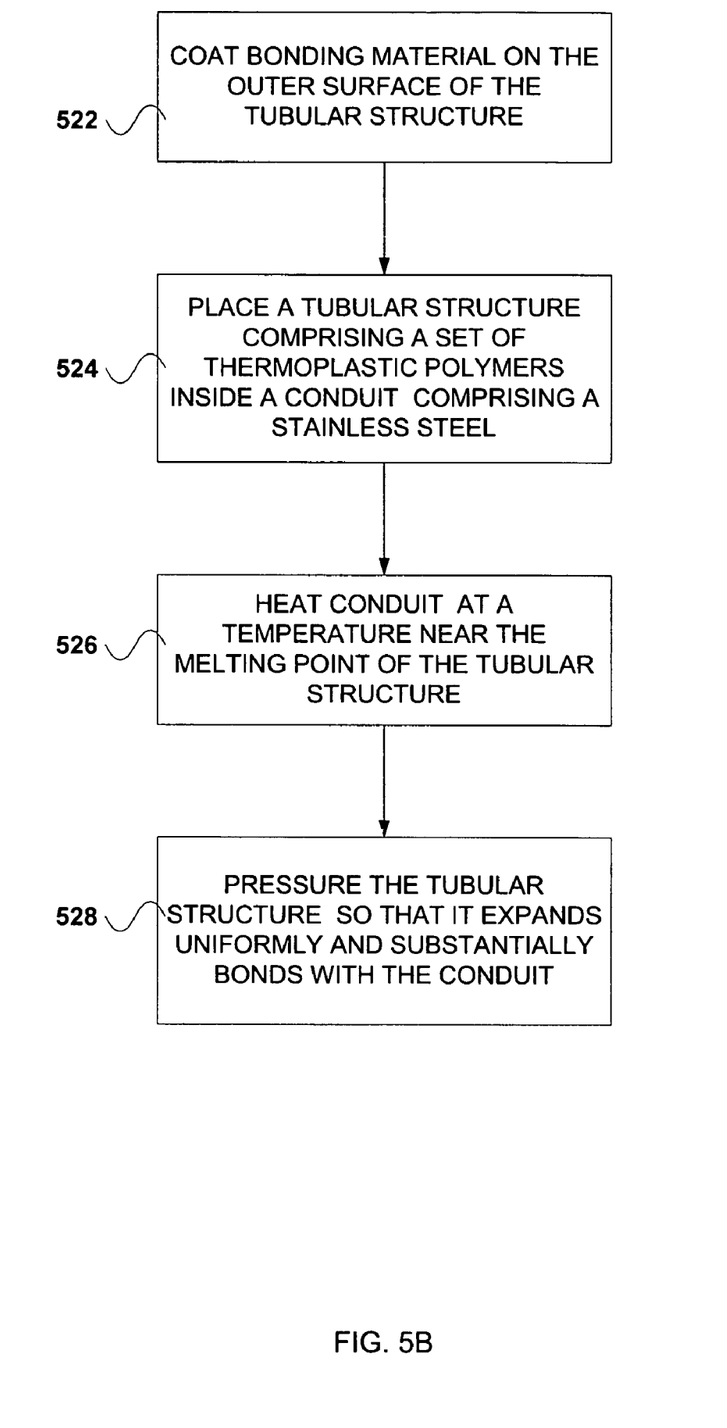
Figure 5C:
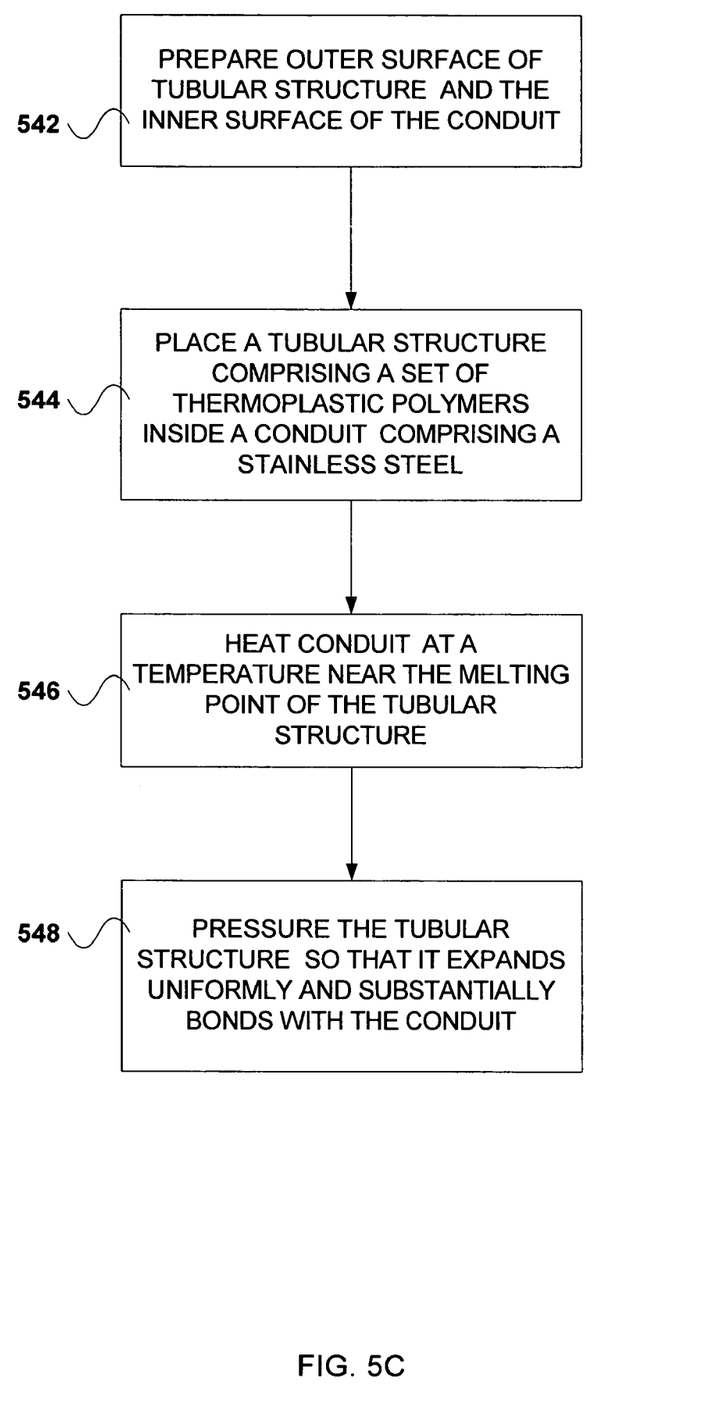

Referring now to FIGS. 5A–C, a simplified set of steps are shown in which a thermoplastic polymer tube is coupled to a stainless steel conduit in a gas distribution system. FIG. 5A shows a set of simplified steps for bonding a thermoplastic tubular structure inside a stainless steel conduit, according to one embodiment of the invention. Initially, a tubular structure comprising a set of thermoplastic polymers, such as a Teflon material, is placed inside a stainless steel conduit, at step 502. Bonding material is then injected between the stainless steel conduit and the tubing structure at step 504. The stainless steel conduit is heated at a temperature near the melting point of the tubular structure at step 506. The tubular structure is then pressurized so that it expands uniformly and substantially bonds with the tubular structure, at step 508.

FIG. 5B shows a set of simplified steps for bonding a thermoplastic tube structure inside a conduit according to one embodiment of the invention. Initially, bonding material is coated on the outer surface of the tubing structure at step 522. A tubular structure comprising a set of thermoplastic polymers, such as Teflon, is then placed inside a conduit comprising a set of metals, such as stainless steel, at step 524. The conduit is heated at a temperature near the melting point of the tubing structure, at step 526. The tubing structure is then pressured so that it expands uniformly and substantially bonds with the tubing structure, at step 528.

FIG. 5C shows a set of simplified steps for bonding a prepared thermoplastic tube structure inside a metal tube structure, according to one embodiment of the invention. Initially, a bonding material is coated on the outer surface of the tubular structure, at step 542. The tubular structure comprising a set of thermoplastic polymers is then placed inside a conduit comprising a set of metals, at step 544. The conduit is heated at a temperature near the melting point of the tubular structure at step 546. The second tubular structure is then pressured so that it expands uniformly and substantially bonds with the first tubing structure, at step 548.

Figure 6:
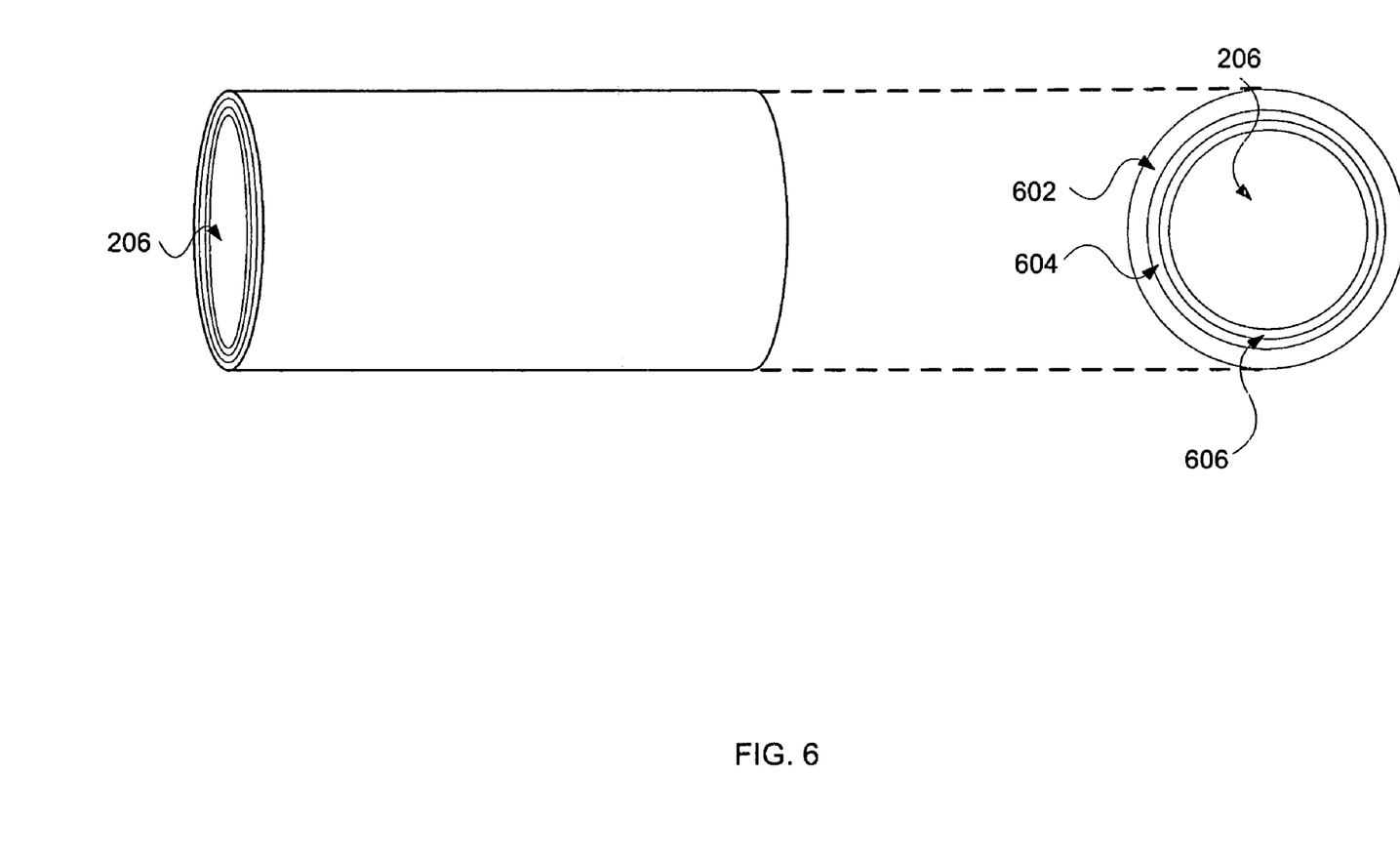
FIG. 6 describes a simplified diagram of a gas distribution conduit in which a thermo-plastic polymer is optimized though injection molding, according to one embodiment of the invention; and, FIGS. 7A–C describes a simplified set of steps in which a thermo-plastic polymer tubular structure is longitudinally coupled to the inner cavity of stainless steel conduit by the injection of a bonding material, according to one embodiment of the invention.

Referring now to FIG. 6, a simplified diagram of a gas distribution conduit in which a thermo-plastic polymer is optimized though injection molding according to one embodiment of the invention. Injection molding is a manufacturing process where plastic is forced into a mold cavity under pressure. As in FIG. 4, a gas distribution system channels 206 plasma processing gases through stainless steel conduit 602 from compressed gas cylinders to the plasma processing chamber. In a non-obvious fashion, a thermo-plastic polymer tubular structure 606 has been longitudinally coupled to the inner cavity of stainless steel conduit 602, by the injection of a bonding material 604.

In general, a typical injection molding machine consists of the following major components: injection system, hydraulic system, mold system, clamping system, and a control system. The injection system consists of a hopper, a reciprocating screw and barrel assembly, and an injection nozzle. This system confines and transports the plastic as it progresses through the feeding, compressing, degassing, melting, injection, and packing stages.

The hydraulic system on the injection molding machine provides the power to open and close the mold, build and hold the clamping tonnage, turn the reciprocating screw, drive the reciprocating screw, and energize ejector pins and moving mold cores. A number of hydraulic components are required to provide this power, which include pumps, valves, hydraulic motors, hydraulic fittings, hydraulic tubing, and hydraulic reservoirs.

The typical mold system consists of the delivery system and the molded parts.

The clamping system opens and closes the mold, supports and carries the constituent parts of the mold, and generates sufficient force to prevent the mold from opening. Clamping force can be generated by a mechanical (toggle) lock, hydraulic lock, or a combination of the two basic types.

The control system provides consistency and repeatability in machine operation. It monitors and controls the processing parameters, including the temperature, pressure, injection speed, screw speed and position, and hydraulic position. The process control has a direct impact on the final part quality and the economics of the process. Process control systems can range from a simple relay on/off control to an extremely sophisticated microprocessor-based, closed-loop control.

A mold cavity is essentially a negative of the part being produced. The cavity is filled with plastic, and the plastic changes phase to a solid, resulting in a positive. Typically injection pressures range from 5000 to 20,000 psi. Because of the high pressures involved, the mold must be clamped shut during injection and cooling. Clamping forces are measured in tons.

Figure 7A:
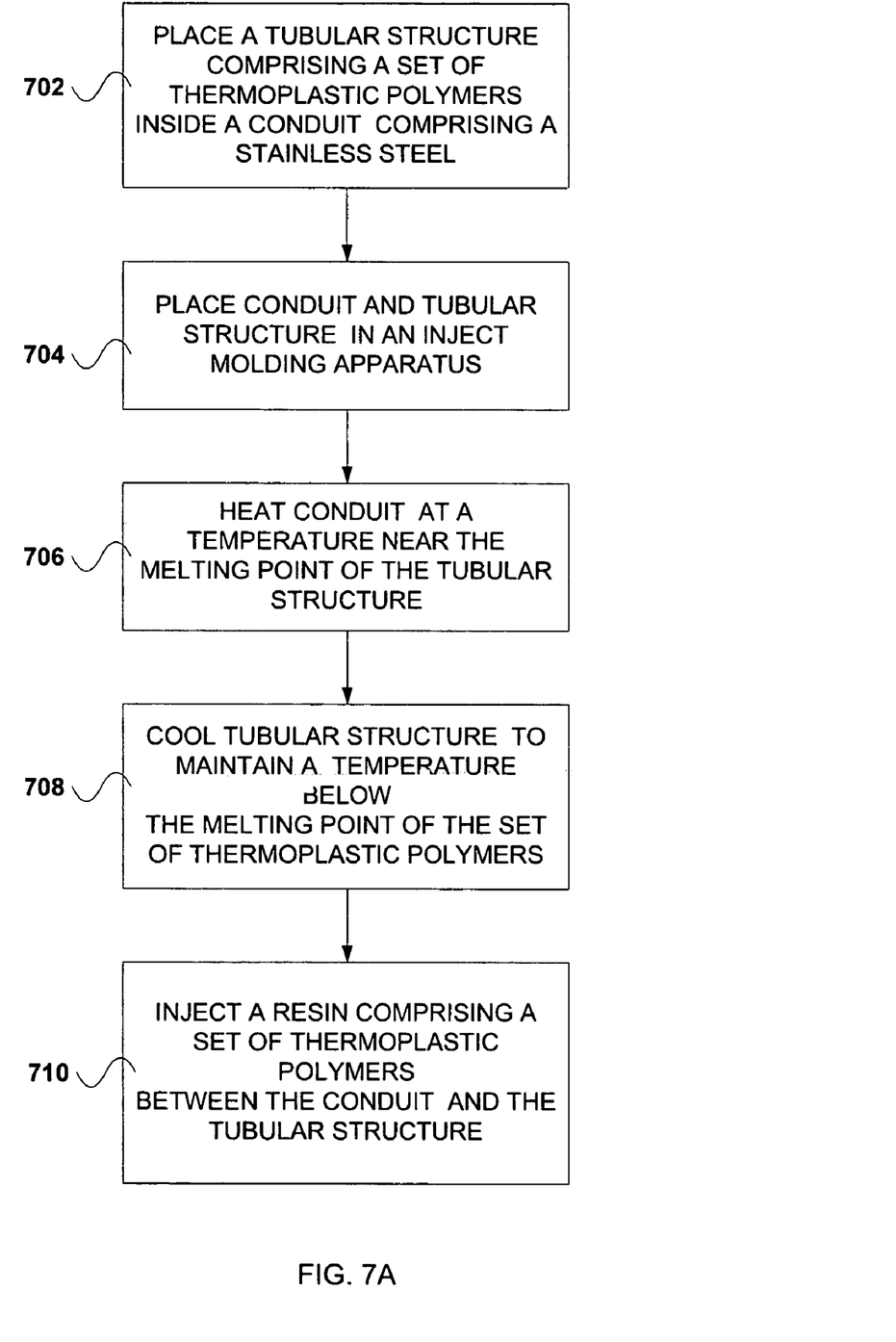
Figure 7B:
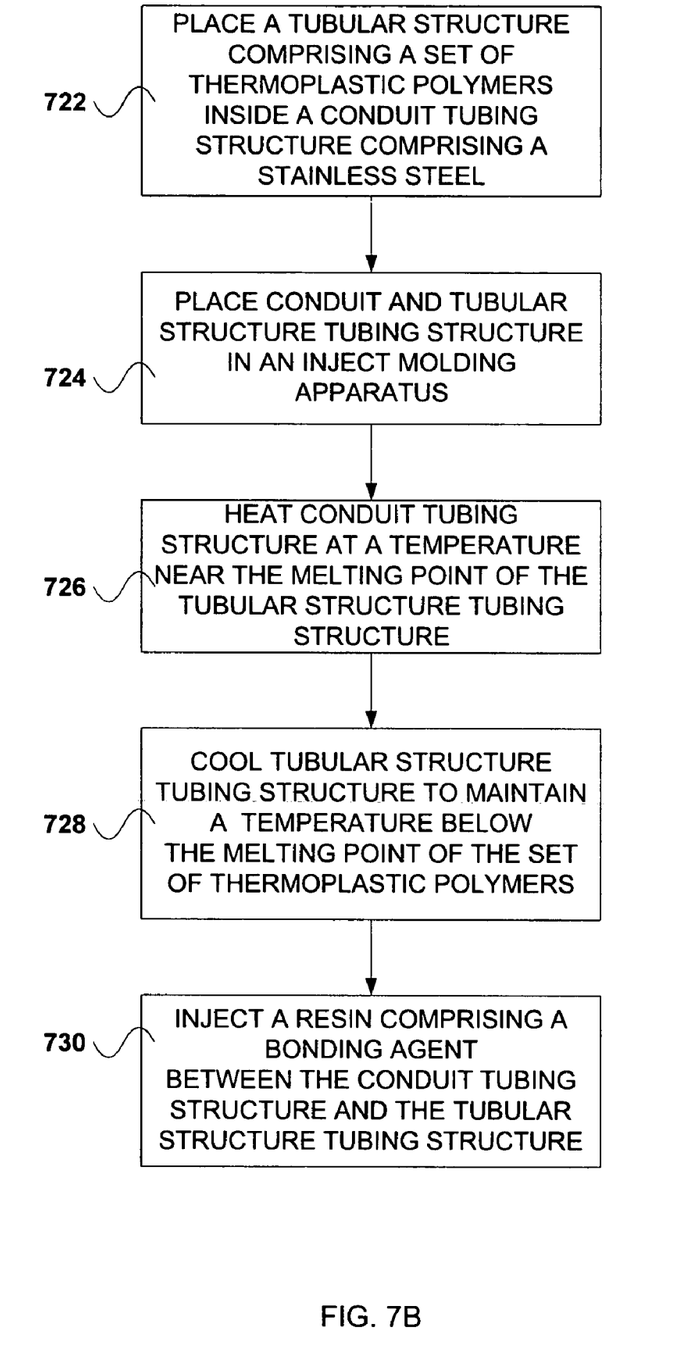
Figure 7C:
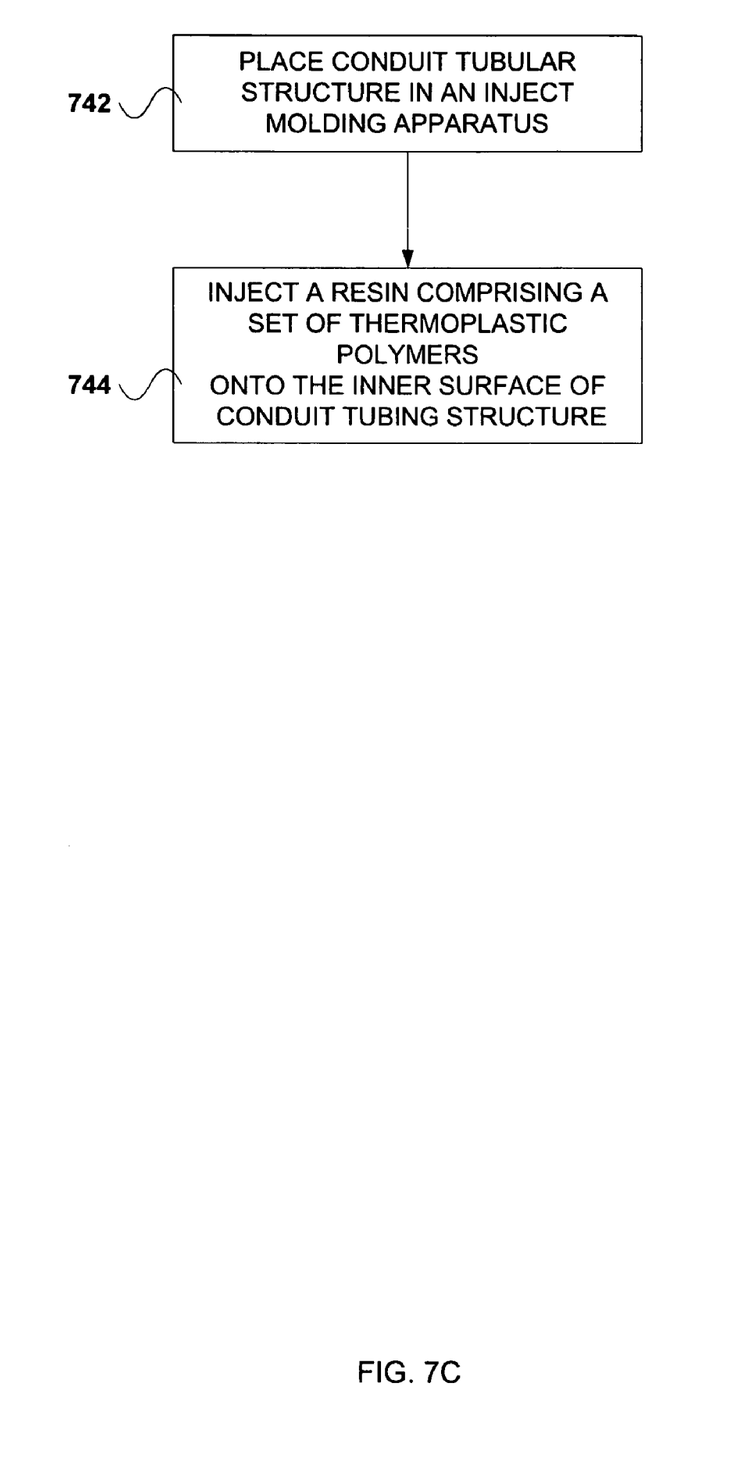

Referring now to FIGS. 7A–C, a simplified set of steps are shown in which a thermo-plastic polymer tubular structure is longitudinally coupled to the inner cavity of stainless steel conduit 404, by the injection of a bonding material 604.

FIG. 7A shows a set of simplified steps for bonding a prepared thermoplastic polymer tubing structure inside a metal tube structure with a thermoplastic polymer resin, according to one embodiment of the invention. Initially, a tubular structure comprising a set of thermoplastic polymers is placed inside conduit comprising a stainless steel, at step 702. The conduit and tubular structure are then placed in an inject molding apparatus, at step 704. The conduit is heated at a temperature near the melting point of the second tubing structure, at step 706. The tubular structure is then cooled to maintain a temperature below the melting point of the set of thermoplastic polymers, at step 708. A resin comprising a set of thermoplastic polymers is then injected between the conduit and the tubular structure, at step 710.

FIG. 7B shows a set of simplified steps for bonding a prepared thermoplastic polymer tubular structure inside a conduit comprising a stainless steel with a thermoplastic polymer resin, according to one embodiment of the invention. Initially, a tubular structure comprising a set of thermoplastic polymers is placed inside a conduit comprising a stainless steel, at step 722. The conduit and tubular structure are then placed in an inject molding apparatus, at step 724. The conduit is then heated at a temperature near the melting point of the tubular structure, at step 726. The tubular structure is then cooled to maintain a temperature below the melting point of the set of thermoplastic polymers, at step 728. A resin comprising a bonding agent is then injected between the conduit and the tubular structure, at step 730.

FIG. 7C shows a set of simplified steps for bonding a thermoplastic tubular structure inside a conduit comprising a stainless steel with a resin, according to one embodiment of the invention. Initially, the conduit is placed in an inject molding apparatus, at step 742. A resin comprising a set of thermoplastic polymers is then injected onto the inner surface of the conduit at step 744.

While this invention has been described in terms of several preferred embodiments, there are alterations, permutations, and equivalents which fall within the scope of this invention. For example, although the present invention has been described in connection with Lam Research plasma processing systems (e.g., Exelan, Exelan HP, Exelan HPT, 2300, Versys Star, etc.), other plasma processing systems may be used. Furthermore, although inject molding has been described, other forms of molding may be used (e.g., blow molding, etc.). It should also be noted that there are many alternative ways of implementing the methods of the present invention.

Advantages of the invention include optimizing the delivery of a set of gases in a plasma processing system. Additional advantages include minimizing the corrosion caused by plasma processing gasses on a gas distribution system of a plasma processing system, particularly at specific points such as weld bead and heat-affected zones (HAZ); and the substantial blocking of the permeation of atmospheric containments (e.g., $H_2O$, $N_2$, $O_2$, etc.) into the gas distribution system by a surrounding stainless steel enclosure.

Having disclosed exemplary embodiments and the best mode, modifications and variations may be made to the disclosed embodiments while remaining within the subject and spirit of the invention as defined by the following claims.

What is claimed is:

1. A method for configuring a gas distribution channel, said gas distribution channel being configured for introducing a plasma source gas into a plasma processing chamber of a plasma processing system, comprising:
   providing a metal conduit;
   providing a thermo-plastic tubular structure;
   disposing said thermo-plastic tubular structure within said metal conduit;
   heating said metal conduit, containing said thermo-plastic tubular structure disposed within, to a first temperature;
   pressurizing said thermo-plastic tubular structure causing said thermo-plastic tubular structure to mechanically couple with said metal conduit wherein an outer surface of said thermo-plastic tubular structure is longitudinally coupled with an inner surface of said metal conduit;
   cooling said thermo-plastic tubular structure to a second temperature that is below the melting point of thermo-plastic material of said thermo-plastic tubular structure; and
   injecting a resin material between said metal conduit and the thermo-plastic tubular structure after said cooling.

2. The method of claim 1 further comprising configuring said gas distribution channel to enable a flow of said plasma processing source gas through said channel to be controlled by a mass flow controller of said plasma processing system.

3. The method of claim 1, wherein said resin material includes a set of thermoplastic polymers.

4. The method of claim 3, where said resin material includes a bonding agent.

5. The method of claim 3, where said resin material is PTFE.

6. The method of claim 3, where said resin material is FEP.

7. The method of claim 3, where said resin material is PFA.

8. The method of claim 3, where said resin material is PCTFE.

9. The method of claim 3, where said resin material is CTFE.

10. The method of claim 1, where said metal conduit is stainless steel.

11. The method of claim 1, where said metal conduit is copper.

12. The method of claim 1, where said metal conduit is aluminum.

13. The method of claim 1, where said metal conduit is a metal alloy.

14. The method of claim 1, where said thermo-plastic tubular structure is PTFE.

15. The method of claim 1, where said thermo-plastic tubular structure is FEP.

16. The method of claim 1, where said thermo-plastic tubular structure is PFA.

17. The method of claim 1, where said thermo-plastic tubular structure is PCTFE.

18. The method of claim 1, where said thermo-plastic tubular structure is CTFE.

* * * * *